United States Patent
Jeon et al.

(10) Patent No.: US 9,891,733 B2
(45) Date of Patent: Feb. 13, 2018

(54) TOUCH SCREEN PANEL

(71) Applicant: Samsung Display Co., Ltd., Yongin-si (KR)

(72) Inventors: Byeong Kyu Jeon, Busan (KR); Hyung Chul Kim, Asan-si (KR); Jung Mok Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 226 days.

(21) Appl. No.: 14/843,467

(22) Filed: Sep. 2, 2015

(65) Prior Publication Data
US 2016/0239116 A1 Aug. 18, 2016

(30) Foreign Application Priority Data
Feb. 13, 2015 (KR) .................. 10-2015-0022409

(51) Int. Cl.
*G06F 3/041* (2006.01)
*H05K 1/02* (2006.01)
*H05K 1/18* (2006.01)

(52) U.S. Cl.
CPC ............ *G06F 3/041* (2013.01); *H05K 1/028* (2013.01); *H05K 1/189* (2013.01); *H05K 2201/056* (2013.01); *H05K 2201/10901* (2013.01)

(58) Field of Classification Search
CPC .......... G06F 3/041; H01L 2224/73265; H05K 2201/055; H05K 2201/056; H05K 1/028; H05K 5/0056; H05K 5/0052; H05K 1/118; H05K 1/184; H05K 2201/09574; H05K 2201/09281; H05K 2201/09263; H05K 1/11; H05K 2201/09754; H05K 5/00; H05K 2201/10901; H05K 1/113; H05K 1/115; H05K 1/112; H05K 1/111; H05K 1/116; H05K 1/117; H05K 1/147; H05K 1/189
USPC ......... 361/749, 760, 752, 772, 767; 174/251
See application file for complete search history.

(56) References Cited

U.S. PATENT DOCUMENTS

| 7,586,744 | B2 * | 9/2009 | Okuda ............. | G02F 1/133308 313/582 |
| 8,203,834 | B2 * | 6/2012 | Kwon ................. | G02F 1/1333 349/56 |
| 8,269,940 | B2 * | 9/2012 | Kuo .................... | G06F 3/0412 349/12 |
| 2005/0094052 | A1 * | 5/2005 | Sakurai ............. | G02F 1/133308 349/58 |

(Continued)

FOREIGN PATENT DOCUMENTS

JP 2002-111140 A * 4/2002
KR 10-2007-0090615 9/2007

(Continued)

*Primary Examiner* — Julie Anne Watko
(74) *Attorney, Agent, or Firm* — H.C. Park & Associates, PLC

(57) ABSTRACT

A touch screen panel includes: a touch sensor film including: at least one corner formed in a curved line; and a through part; and a flexible printed circuit board including one end connected to a wiring extending from the touch sensor film; the flexible printed circuit board disposed through the through part, wherein the through part is disposed adjacent to the corner of the touch sensor film formed in the curved line, and wherein the through part includes a curved line corresponding to the corner of the touch sensor film formed in the curved line.

5 Claims, 3 Drawing Sheets

(56) References Cited

U.S. PATENT DOCUMENTS

| | | | |
|---|---|---|---|
| 2005/0233611 A1* | 10/2005 | Sung | G02F 1/13452 |
| | | | 439/67 |
| 2005/0286008 A1* | 12/2005 | Miyagawa | G06F 1/1601 |
| | | | 349/158 |
| 2007/0291963 A1* | 12/2007 | Watanabe | G06F 3/041 |
| | | | 381/152 |
| 2012/0146857 A1* | 6/2012 | Wang | H01Q 1/2258 |
| | | | 343/702 |
| 2013/0258817 A1 | 10/2013 | Corvino | |
| 2015/0015511 A1* | 1/2015 | Kwak | G06F 3/0416 |
| | | | 345/173 |
| 2016/0004116 A1* | 1/2016 | Son | G02B 6/0083 |
| | | | 349/58 |

FOREIGN PATENT DOCUMENTS

| | | |
|---|---|---|
| KR | 10-2013-0106134 | 9/2013 |
| KR | 10-2014-0063971 | 5/2014 |

\* cited by examiner

TOUCH SCREEN PANEL

CROSS-REFERENCE TO RELATED APPLICATION

This application claims priority from and the benefit of Korean Patent Application No. 10-2015-0022409, filed on Feb. 13, 2015, which is hereby incorporated by reference for all purposes as if fully set forth herein.

BACKGROUND

Field

Exemplary embodiments relate to a touch screen panel.

Discussion of the Background

With the development of electronic technology, various types of electronic devices have been developed and proliferated.

In particular, products may include portable devices that may be worn on a user's wrist, head and/or ear. Such a device that may be worn on a user's body is generally referred to as a wearable device.

The wearable device may have a quadrangle shape like a conventional portable device, but may also have a rounded corner and/or a circular body to improve its appearance or comfort.

The wearable device is generally equipped with a touch sensor for convenience of operation. However, since the conventional touch sensor is designed to correspond to a rectangular terminal, the touch sensor applied to a curved apparatus may have an area larger than an area which may be actually touched. Therefore, only a portion of the area which may be actually touched may have touch functionality.

The above information disclosed in this Background section is only for enhancement of understanding of the background of the invention and therefore it may contain information that does not form the prior art that is already known in this country to a person of ordinary skill in the art.

SUMMARY

Exemplary embodiments provide a touch screen panel having advantages of an increased touch-enabled area.

Exemplary embodiments provide a touch screen panel having a through part through which a flexible printed circuit board (PCB) passes.

Additional aspects will be set forth in the detailed description which follows, and, in part, will be apparent from the disclosure, or may be learned by practice of the inventive concept.

Exemplary embodiments disclose a touch screen panel including: a touch sensor film including: at least one corner formed in a curved line; and a through part; and a flexible printed circuit board including one end connected to a wiring extending from the touch sensor film; the flexible printed circuit board disposed through the through part, wherein the through part is disposed adjacent to the corner of the touch sensor film formed in the curved line, and wherein the through part includes a curved line corresponding to the corner of the touch sensor film formed in the curved line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
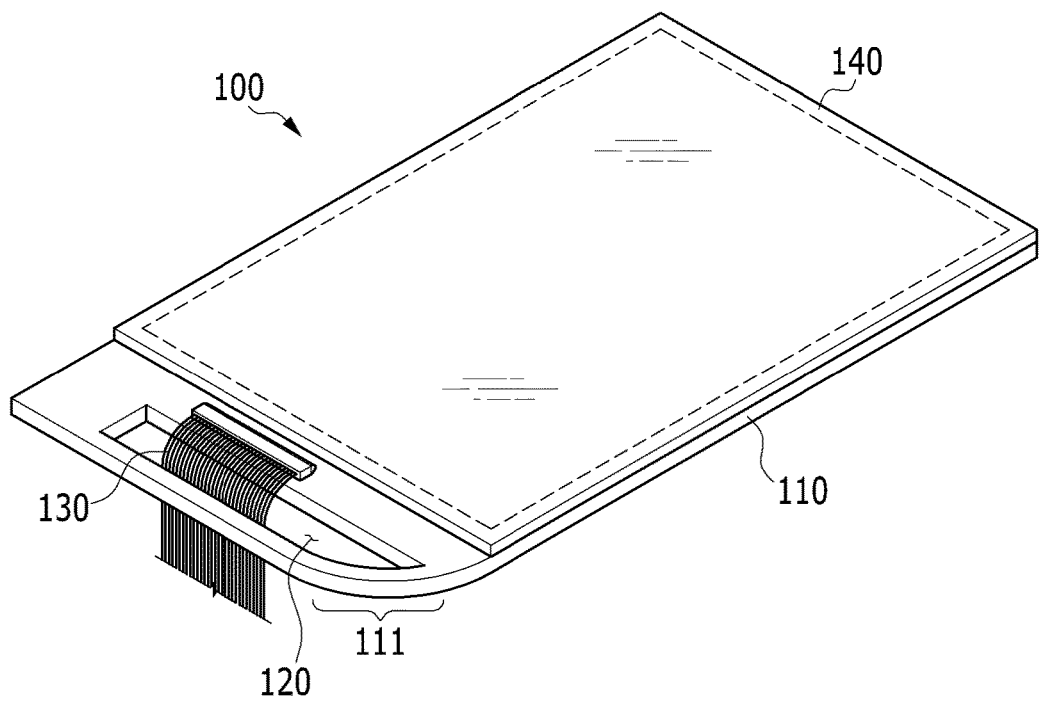
FIG. 1 is a perspective view illustrating a touch screen panel according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a perspective view illustrating a touch screen panel according to an exemplary embodiment.

Referring to FIG. 1, a touch screen panel 100 according to an exemplary embodiment may include a touch sensor film 110 and a flexible printed circuit board 130.

The touch sensor film 110 has at least one corner 111 formed in a curved line. The touch sensor film 110 includes a through part 120.

A portion of the touch sensor film 110 may be provided with a touch part (not illustrated). The touch part is a part where a user touch is recognized. In the touch screen panel 100, according to the exemplary embodiments, an area of the touch part disposed on the touch sensor film 110 may be formed larger than the conventional touch screen panel. A shape of the through part 120 therefor will be described below.

A reinforcing film may be disposed on one surface of the touch sensor film 110. The reinforcing film 140 may be configured to protect the touch sensor film 110. However, the exemplary embodiments are not limited thereto, and the reinforcing film 140 may be omitted.

One end of the flexible printed circuit board 130 is disposed through the through part 120 and connected to the touch sensor film 110. That is, the flexible printed circuit board 130 connects an upper surface of the touch sensor film 110 and controllers (not illustrated) disposed below or on a lower surface of the touch sensor film 110. The controller may control, for example, the general operation of the touch sensor film 110. The flexible printed circuit board 130 supplies power to the touch sensor film 110 and/or transfers a touch signal received by the touch part to the controller.

The through part 120 is disposed adjacent to the corner 111 formed in a curved line of the touch sensor film 110. The through part 120 includes a curved line corresponding to the corner 111 formed in the curved line of the touch sensor film 110. The through part 120 may have the same curvature radius as that of the corner 111 formed in the curved line of the touch sensor film 110.

The through part 120 has a shape vertically penetrating through the touch sensor film 110, and a portion of the touch sensor film 110 is disposed around the through part 120. According to the exemplary embodiments, the area occupied by the through part 120 and the portion of the touch sensor film 110 disposed around the through part 120 may be reduced or minimized with respect to the area of the touch sensor film 110. The through part 120 may also guide the flexible printed circuit board 130, and thus the flexible printed circuit board 130 may be disposed connecting the upper and lower surfaces of the touch sensor film 110.

The area of the through part 120 may be equal to or larger than a cross sectional thickness of the flexible printed circuit board 130. When the area of the through part 120 is equal to the cross sectional thickness of the flexible printed circuit board 130, the area of the touch sensor film 110 occupied by the touch part may be increased or maximized.

According to the touch screen panel 100 according to the exemplary embodiments, a portion of the through part 120 is formed in a curved line, and therefore, the area of the touch sensor film 110 occupied by the through part 120 may be reduced or minimized. Accordingly, an available area of the touch sensor film 110 may be larger than the conventional touch screen panel by reducing or minimizing dead space in the touch sensor film 110. Therefore, the touch screen panel 100 according to the exemplary embodiments may have increased area for touch function.

Furthermore, when the touch screen panel 100 is equipped in a portable terminal, the dead space of the touch sensor film 110 may be minimized, and thus, the portable terminal may be designed accordingly.

Figure 2:
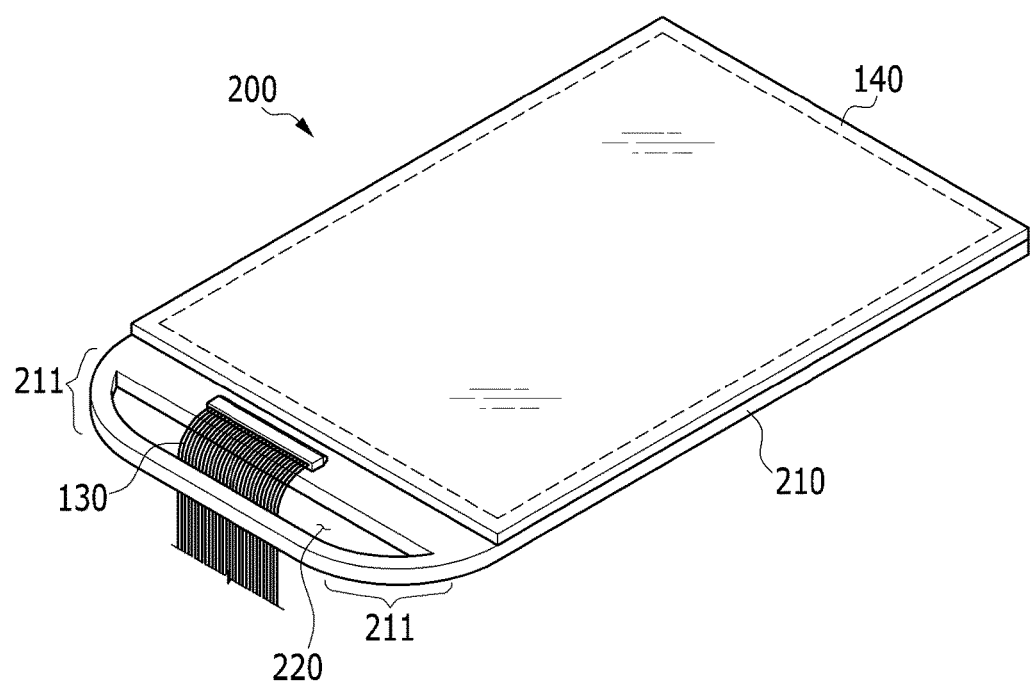
FIG. 2 is a perspective view illustrating a touch screen panel according to one or more exemplary embodiments.

FIG. 2 is a perspective view illustrating a touch screen panel 200 according to an exemplary embodiment.

Referring to FIG. 2, the touch screen panel 200 may include a touch sensor film 210 and the flexible printed circuit board 130. The touch sensor film 210 may have two adjacent corners 211 formed in curved lines. Further, the through part 220 may be formed at a predetermined interval from the two adjacent corners 211.

The entire shape of the touch sensor film 210 may have a rectangle or a square. Further, the two adjacent corners 211 of the touch sensor film 210 may be formed in curved lines. The through part 220 may also be formed in curved lines corresponding to the two adjacent corners 211 formed in curved lines, and thus the area occupied by the through part 220 in the touch sensor film 210 may be reduced or minimized.

Figure 3:
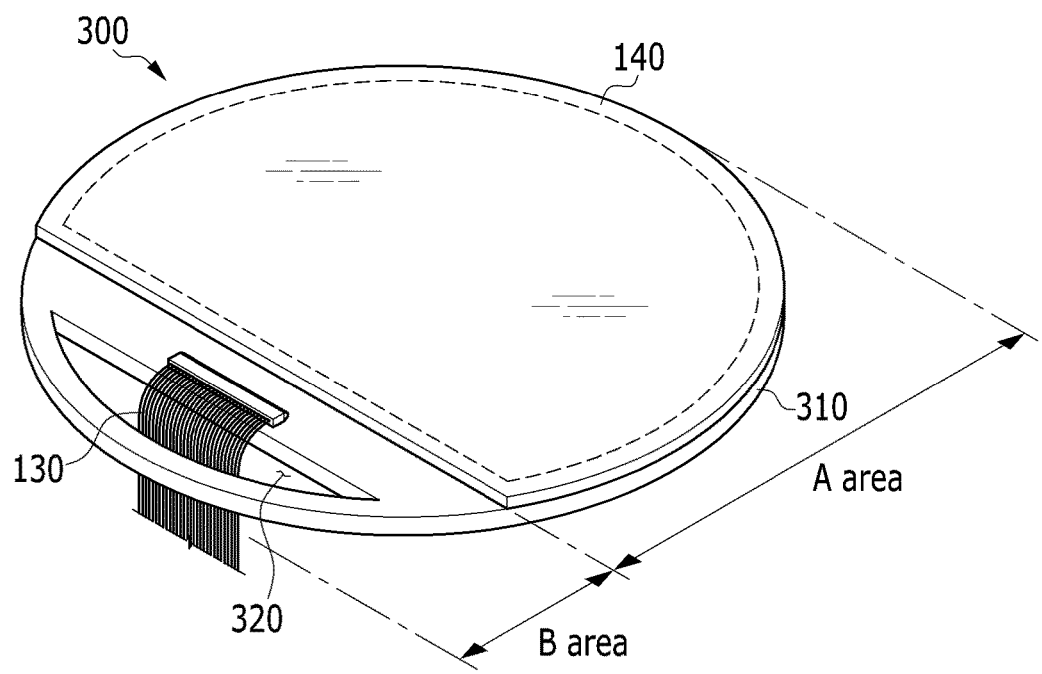
FIG. 3 is a perspective view illustrating a touch screen panel according to one or more exemplary embodiments.

FIG. 3 is a perspective view illustrating a touch screen panel according to an exemplary embodiment.

Referring to FIG. 3, the touch screen panel 300 may include a touch sensor film 310 and the flexible printed circuit board 130. The flexible printed circuit board 130 is substantially similar to the flexible printed circuit board 130 (see FIG. 2) according to the foregoing exemplary embodiments, and therefore a detailed description thereof will be omitted.

In the touch screen panel 300 according to the exemplary embodiments, the touch sensor film 310 is formed in a circle.

The through part 320 is disposed adjacent to the corner of the touch sensor film 310, and a portion of the through part is formed in an arc shape corresponding to the corner of the touch sensor film 310. The arc shape of the through part 320 and the arc shape of the touch sensor film 310 may have same center of curvature. That is, a thickness of the edge surrounding the through part 320 in the touch sensor film 310 may be constant.

In the touch screen panel 300 according to an exemplary embodiment, the dead space (area B) occupied by the through part 320 may be reduced or minimized. Therefore, the touch screen panel 300 equipped in a circular portable terminal according to the exemplary embodiments may have increased available area (area A) for the touch function.

Generally, a touch screen panel may be attached to the touch panel. Further, a size of the touch screen panel may be equal to or larger than the display panel from which the image is displayed, since the touch sensing should be provided even in the circumference of the display screen. Therefore, reducing the dead space of the touch screen panel may be important.

The touch screen panel 300 according to the exemplary embodiments may include a curved line so that the through part 320 corresponds to the curved portion of the touch sensor film 310. Accordingly, the available area (area A) may be larger than the conventional touch screen panel by minimizing the dead space (area B) in the touch sensor film 310. Therefore, the available area (area B) that may be used for touch function may be larger than the conventional touch screen panel having same size of the portable terminal.

The touch screen panel according to the exemplary embodiments may be equipped in portable electronic devices such as a smart watch, a mobile phone, a smart phone, a tablet, an e-book terminal, a personal digital assistant (PDA), a portable multimedia player (PMP), and a digital broadcasting receiver.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch screen panel, comprising:
    a touch sensor film comprising:
        at least one corner formed in a curved line; and
        a through part; and
    a flexible printed circuit board comprising one end connected to a wiring extending from the touch sensor film; the flexible printed circuit board disposed through the through part,
    wherein the through part is disposed adjacent to the corner of the touch sensor film formed in the curved line,
    wherein the through part comprises a curved line corresponding to the corner of the touch sensor film formed in the curved line, and
    wherein a curvature of the curved line of the through part and a curvature of the corner of the touch sensor film formed in the curved line are the same.

2. The touch screen panel of claim 1, wherein:
    the at least one corner comprises two adjacent corners, each of the two adjacent corners are respectively formed in a curved line, and
    the through part is disposed at a predetermined interval from the two adjacent corners.

3. The touch screen panel of claim 1, wherein:
    a width of the through part is larger than a cross sectional thickness of the flexible printed circuit board.

4. The touch screen panel of claim 1, further comprising a reinforcing film disposed on an upper surface of the touch sensor film.

5. A touch screen panel, comprising:
    a touch sensor film comprising a through part; and
    a flexible printed circuit board comprising one end connected to a wiring extending from the touch sensor film; the flexible printed circuit board disposed through the through part,
    wherein the touch sensor film is formed in a circle,
    wherein the through part is disposed adjacent to a part of the edge formed in a curved line of the touch sensor film, the through part is formed in an arc shape corresponding to the part of the edge of the touch sensor film, and
    wherein a curvature of a part of the through part and a curvature of the part of the edge are the same.

* * * * *